United States Patent [19]

Mankut et al.

[11] Patent Number: 4,828,878
[45] Date of Patent: May 9, 1989

[54] DEVICE FOR AND METHOD OF TREATING OBJECTS, PARTICULARLY PRINTED CIRCUIT BOARDS

[75] Inventors: Ludwig Mankut, Altdorf; Horst Blaesing, Berlin; Thomas Kosikowski, Nuremberg; Walter Meyer, Berlin; Rudolf Kreisel, Nuremberg, all of Fed. Rep. of Germany

[73] Assignee: Schering Aktiengesellschaft, Berlin, Fed. Rep. of Germany

[21] Appl. No.: 897,196

[22] Filed: Aug. 14, 1986

[30] Foreign Application Priority Data

Aug. 14, 1985 [DE] Fed. Rep. of Germany ....... 3529313

[51] Int. Cl.$^4$ .............................................. B05D 5/12
[52] U.S. Cl. ...................................... 427/98; 427/96; 427/430.1; 118/221; 118/423; 118/425; 118/500
[58] Field of Search .................. 427/96, 98, 430.1; 118/500, 221, 423, 425; 134/67, 68, 123, 124, 128

[56] References Cited

U.S. PATENT DOCUMENTS

| | | | |
|---|---|---|---|
| 2,372,898 | 4/1945 | Jackson | 134/67 |
| 3,253,943 | 5/1966 | Mayer | 118/423 |
| 3,868,272 | 2/1975 | Tardoskegyi | 134/131 |
| 4,187,801 | 2/1980 | Monk | 118/500 |
| 4,232,060 | 11/1980 | Mallory | 427/98 |
| 4,408,560 | 10/1983 | Caratsch | 118/425 |
| 4,570,569 | 2/1986 | Kondo | 118/500 |
| 4,611,554 | 9/1986 | Mahlkow | 118/326 |

Primary Examiner—Shrive Beck
Assistant Examiner—Vi Duong Dang
Attorney, Agent, or Firm—Michael J. Striker

[57] ABSTRACT

Objects such as for example printed circuit boards are transported for treating through a treatment container which accommodates a treating medium in a lower plane being supported by clamps of object supports, and then the object supports with the clamps are returned to a starting position in an upper plane.

11 Claims, 3 Drawing Sheets

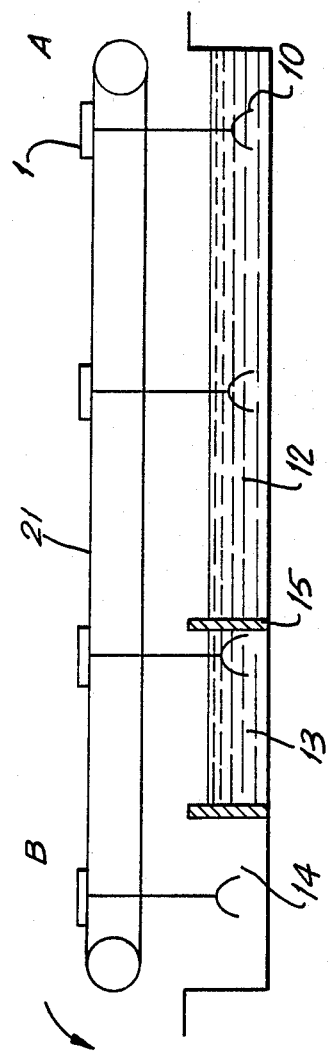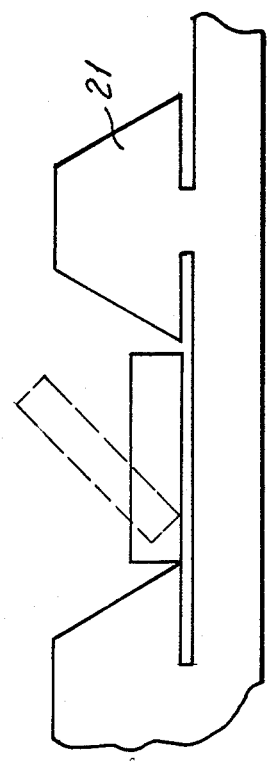

DEVICE FOR AND METHOD OF TREATING OBJECTS, PARTICULARLY PRINTED CIRCUIT BOARDS

BACKGROUND OF THE INVENTION

The present invention relates to an arrangement for treating objects and particularly printed circuit boards, as well as to a method of treating thereof.

Arrangements and methods of the above mentioned general type are known in the art. They are especially used for manufacture of printed circuits, in accordance with which the printed circuit boards pass through different process steps, such as etching, activation, chemical metallization, galvanic metallization and others, with interposition of washing and drying steps. The treatment is performed generally by means of dipping technique in containers which form mainly a part of the arrangements. The transportation of the objects is performed by means of object supports which transport the flat boards horizontally through the respective treatment solutions.

The disadvantage of the of the known arrangements and methods is that the boards must be as a rule suspended by means of clamping in a manual manner, and after the treatment must be similarly released. Further disadvantages of the known arrangements and methods is that the devices occupy excessive space, and the return to a starting region is performed also in a manual manner or in frame of a round device which occupies excessive space.

SUMMARY OF THE INVENTION

Accordingly, it is an object of the present invention to provide an arrangement for and a method of automatically transporting of objects and treating the objects which provides for a very small space consumption.

In keeping with these objects and with others which will become apparent hereinafter, one feature of the present invention resides, briefly stated, in a treating arrangement for objects, particularly printed circuit boards, which has a treatment container, and transporting means which transport a plurality of supports for objects in two different planes above the treatment container so that in the lower plane the supports with the objects mounted thereon are transported through a treatment medium in the treatment container, while in the upper plane return transportation of the supports is performed.

When the arrangement is designed and the method is performed in accordance with the present invention, an automatic transportation of flat objects, particularly printed circuit boards, and their treatment are achieved in especially space-economical manner which can be considered as a technological breakthrough in the art of producing printed circuit boards. The arrangement and method are suitable for all treatments of flat objects, particularly of printed circuit boards in which treatment solutions are used. It is very advantageous for manufacture of printed circuits on printed circuit boards in electronic and electrical fields.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

FIG. 3 is a view schematically showing a device for return of the object supports to a starting position in an upper plane of the device; and FIG. 3a is a view showing a fragment of the device of FIG. 3, on an enlarged scale.

DESCRIPTION OF A PREFERRED EMBODIMENT

Figure 1:
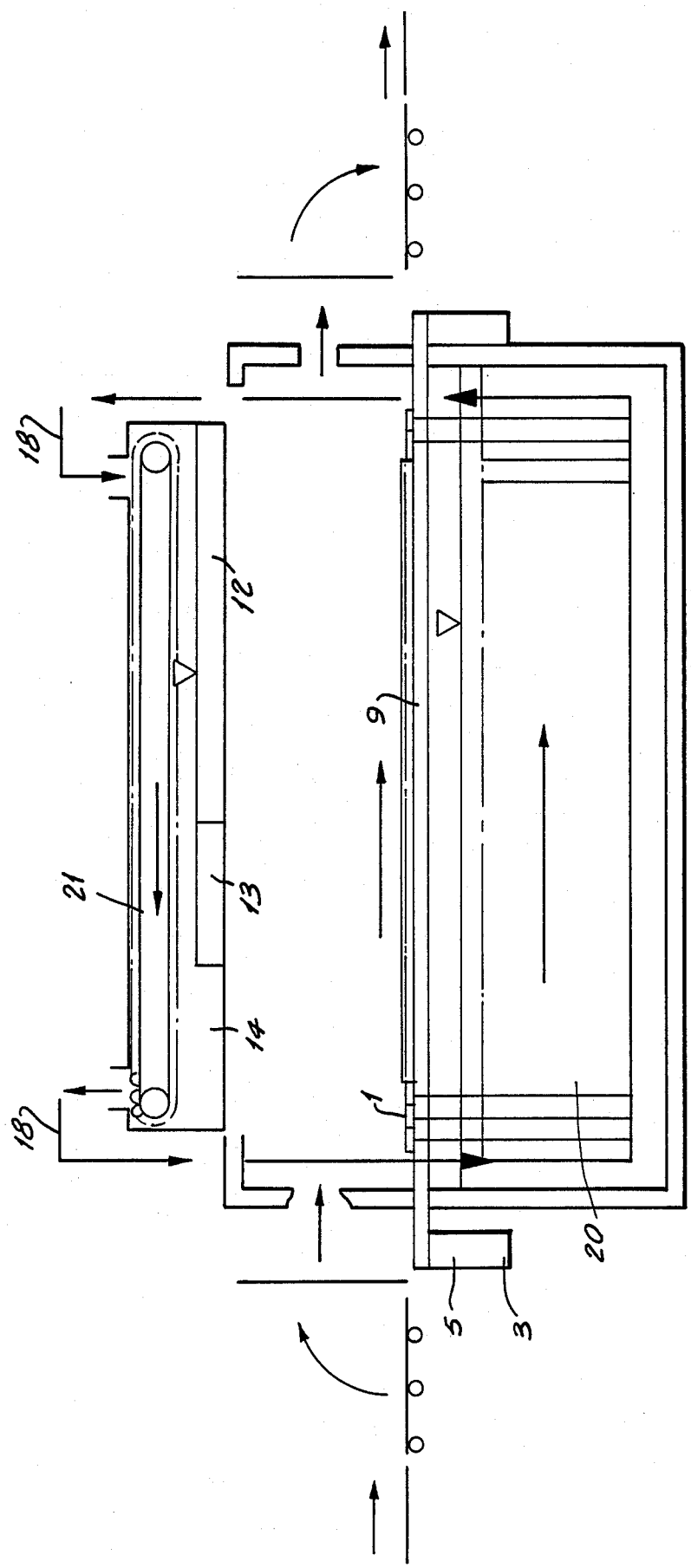
FIG. 1 is a schematic side view of a device for treatment of objects, particularly printed circuit boards, in accordance with the present invention.

A device for treating objects, particularly printed circuit boards, has a treatment container identified with reference numeral 20. The printed circuit boards which are identified with reference numeral 16 are supported during treatment on object supports 1. The device in accordance with the present invention has a device for displacing the supports 1 with the printed circuit boards 16 through the treatment container 20 in a lower plane, and also a device for returning the object supports from their finishing position back to their starting position.

The device for displacing the object supports 1 with the printed circuit boards 16 through the treatment container 20 has a sliding guide strip 2. It further includes a displacing unit which preferably can have a gear motor 3, an eccentric 5, and a carriage 6. An object supporting chain of the device is identified with reference numeral 7, and finally an object moving rail is identified with reference numeral 9.

Prior to entering the treatment container, the printed circuit boards are transported by a conveyor tape 11 and turned from their horizontal position to their vertical position by a tilting unit 17.

The device for returning the object supports from the finishing position to the starting position includes a knub transporting conveyor 21 which has a band provided with a plurality of projections or knubs. The device further has a container or a plurality of containers which include a cleaning container with a stripper zone 12, a [with]a spraying solution 13, and a drying zone 14. The above zones of a single container are separated from one another by a plurality of partitions 15.

A transferring unit 18 is further provided for transferring the object supports 1 from one device to the other device or from one plane to the other plane of the arrangement, and vice versa. The arrows with the black arrow heads identify the direction of transportation of the printed circuit boards, while the arrows with the white arrow heads identify the direction of transportation of object supports.

The device for treating objects and particularly printed circuit boards in accordance with the present invention operates in the following manner.

Boards 16 are horizontally transported by the conveyor 11 which operates continuously or discontinuously. The tilting unit 17 turns the boards 16 from their horizontal position to the vertical position. After this the transferring unit 18 takes the boards over onto the rail 9 with clamps 10. The transporting unit 18 with the plates 16 lowers vertically into the container 20. During displacement of all object supports, the transportation of the boards inside the container 20 takes place, and the entire object set can additionally be moved reversibly by means of an object moving unit 8. In the finishing region the transporting unit 18 transfers the boards in a similar manner as in the starting region. The transporting conveyor 11 can transport the boards 16 continuously or discontinuously.

Figure 2:
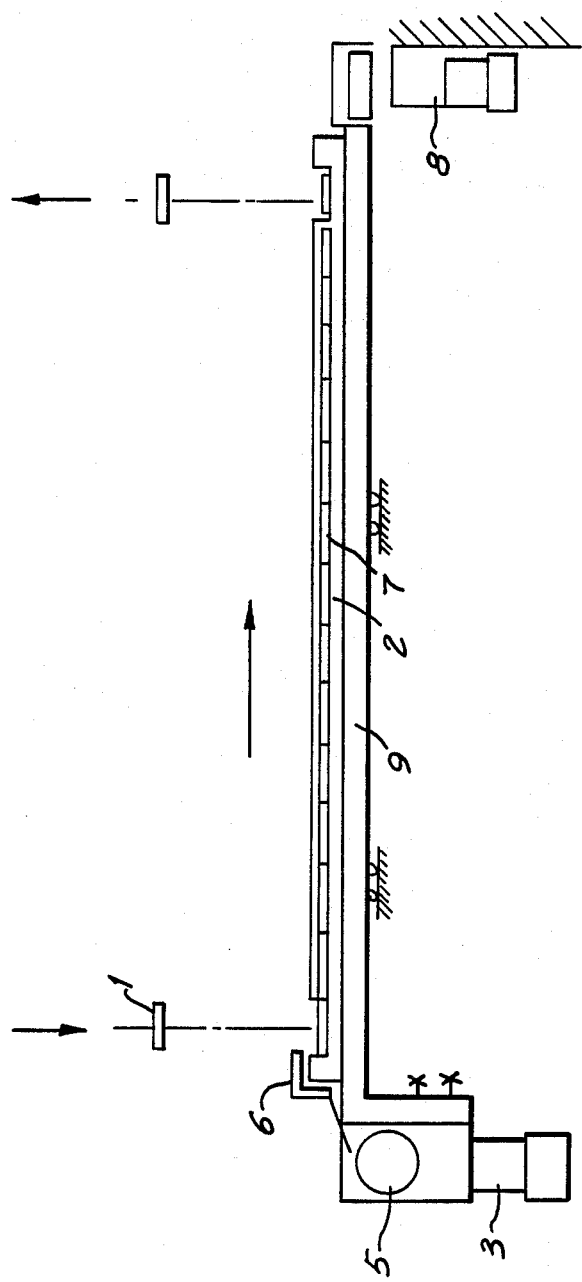
FIG. 2 is a side view schematically showing a device for displacing object supports with the objects mounted thereon through a treatment container in a lower plate of the device.

The device for displacing the object supports 1 with the objects in the container 20 as shown in FIG. 2 operates so that the object supports 1 are first placed on a sliding guide strip 2. The displacing unit which includes the above mentioned gear motor 3, eccentric 5, and carriage 6, displaces the respective object support by one position. At the end of the object supporting chain 7 the last object support is lifted by the transferring unit 18 onto the guiding strip 2. During the treatment time the object supporting chain 7 is moved reversibly by the object reversing unit 8. The displacing unit is mounted on the object moving rail 9 which acts to maintain the object supporting chain 7 closed.

Then the object supports 1 with the clamps 10 return to the starting position. The object supports 1 with the clamps 10 are placed by the transferring unit 18 onto the transporting conveyor 21 in position A. The knub conveyor 21 transports the object supports back to the starting position B. During the transportation the clamps 10 pass through the stripper zone 12, the spraying zone 13, and the drying zone 14. The knub conveyor 21 and more particularly its knub are designed so that the object supports 1 can move freely on the knub conveyor and thereby can overcome the partitions 15 between the above mentioned zones.

It will be understood that each of the elements described above, or two or more together, may also find a useful application in other types of constructions differing from the types described above.

While the invention has been illustrated and described as embodied in an arrangement of and a method for treating objects, particularly printed circuit boards, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A device for treating printed circuit boards, comprising a treatment container which accommodates a treating medium; and transporting means comprising a plurality of supports for mounting boards thereon; a first tilting unit to turn each board to be treated from a horizontal position to a vertical position before the boards enter said treatment container, said transporting means transporting said boards in said vertical position through said treatment container in a lower horizontal plane, said supports including clamps for clamping the boards when the latter are transported in said vertical position through said treatment container, said transporting means also returning said supports back in an upper horizontal plane, said transporting means including a first transport means for displacing simultaneously a plurality of said supports with the boards in said vertical position through said treatment container from a start position to an end position, transfer means for transferring said supports from said lower plane to said upper plane and vice versa, and second transport means positioned in said upper plane and returning said supports in said upper plane to a position corresponding to said start position; a second tilting unit to turn each board from a vertical position to a horizontal position after each board has passed said treatment container to remove each treated board from a respective support in said end position; said second transport means including a return conveyor positioned in said upper plane and returning said supports freed from the boards in said end position to said start position; and a cleaning container positioned to receive said clamps transported with said supports by said return conveyor so that said supports pass through said cleaning container during their return and are cleaned therein.

2. A device as defined in claim 1, wherein said first transport means includes a displacing unit which is arranged in the lower plane so as to displace said supports with the boards with a uniform pace.

3. A device as defined in claim 2, wherein said displacing unit has a sliding guide strip, the supports being placed on said sliding guide strip.

4. A device as defined in claim 2, wherein said displacing unit further includes a gear motor, an eccentric connected with said gear motor, and a carriage connected with said eccentric.

5. A device as defined in claim 2 and further comprising a movnig rail, said displacing unit being mounted on said moving rail.

6. A device as defined in claim 1, wherein said cleaning container includes a compartment with a stripping medium and a compartment with a spraying medium; and further comprising a drying zone arranged subsequently to said compartment with spraying medium.

7. A device as defined in claim 1, wherein said return conveyor has a plurality of projections for lifting the supports with the clamps.

8. A method of treating printed circuit boards, comprising the steps of feeding a plurality of boards to be treated in a horizontal position; tilting said boards from a horizontal position to a vertical position; providing transporting means including a plurality of supports with clamps to hold said boards in said vertical position; providing a treatment container accommodating a treating medium and positioned in a lower plane; displacing a plurality of said supports loaded with the boards and positioned in said vertical position through said treatment container simultaneously in said lower horizontal plane; tilting each board after a treatment in said treatment container from a vertical position to a horizontal position and removing each board from said transporting means; transferring the supports after treating said boards in said treatment container to an upper horizontal plane; providing a cleaning container positioned to receive said clamps freed from said boards and returning the supports with said clamps in said upper horizontal plane while passing said clamps through said cleaning container.

9. A method as defined in claim 8, wherein said displacing step includes vertically lowering the boards clamped with the clamps of the supports into the treatment container filled with the treating medium, and displacing the boards clamped in the clamps on the supports through the treating medium with a uniform pace.

10. A method as defined in claim 8, said returning step including moving the supports with the clamps through said cleaning container accommodating a cleaning solution in a direction which is opposite to that of the displacing of the supports with the boards through the treatment container, and lowering the supports to the lower horizontal plane for engaging further boards.

11. A method as defined in claim 9, and further comprising the steps of pretreating and after-treating of the boards in a horizontal position.

* * * * *